(12) United States Patent
Lin et al.

(10) Patent No.: US 11,862,429 B2
(45) Date of Patent: Jan. 2, 2024

(54) ION IMPLANTATION METHOD AND DEVICE

(71) Applicant: TAIWAN SEMICONDUCTOR MANUFACTURING COMPANY, LTD., Hsinchu (TW)

(72) Inventors: Yi-Hsiung Lin, Zhudong Township (TW); Yao-Jen Yeh, Hsinchu (TW); Chia-Lin Ou, Hsinchu (TW); Cheng-En Lee, Hsinchu (TW); Hsuan-Pang Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/516,426

(22) Filed: Nov. 1, 2021

(65) Prior Publication Data

US 2022/0059320 A1 Feb. 24, 2022

Related U.S. Application Data

(62) Division of application No. 16/525,071, filed on Jul. 29, 2019, now Pat. No. 11,164,722.
(Continued)

(51) Int. Cl.
*H01J 37/317* (2006.01)
*H01L 21/67* (2006.01)
(Continued)

(52) U.S. Cl.
CPC ........ *H01J 37/3171* (2013.01); *H01L 21/265* (2013.01); *H01L 21/67213* (2013.01); *H01J 37/304* (2013.01)

(58) Field of Classification Search
CPC ... H01J 37/3171; H01J 37/304; H01L 21/265; H01L 21/67213
See application file for complete search history.

(56) References Cited

U.S. PATENT DOCUMENTS 9,390,889 B2 7/2016 Watanabe et al.
9,466,467 B2 10/2016 Kabasawa et al.
(Continued)

FOREIGN PATENT DOCUMENTS

CN 104916518 B 9/2015
JP 2011-187309 A 9/2011
(Continued)

OTHER PUBLICATIONS

N. Suetsugu et al., "Energy accuracy and control method fo the NV-GSD-HE," 2000 International Conference on Ion Implantation Technology Proceedings, Ion Implantation Technology—2000 (Cat. No. 00EX432), Alpbach, 2000, p. 448-451, doi: 10.1109/IIT.2000. 924184 (Year: 2000).
(Continued)

*Primary Examiner* — David A Vanore
(74) *Attorney, Agent, or Firm* — Studebaker & Brackett PC (57) ABSTRACT

An ion implantation system comprising: a sample platform; an ion gun; an electrostatic linear accelerator; a direct current (DC) final energy magnet (FEM); and a processor. The processor is programmed to control: a wafer acceptance test instrument, a DC recipe calculator, a DC real energy calculator, and a tool energy shift verifier. The wafer acceptance test instrument is configured to apply a wafer acceptance test (WAT) recipe to a test sample on the sample platform. The DC recipe calculator is configured to calculate a recipe for the DC FEM. The DC real energy calculator is configured to calculate a real energy of the DC FEM. The tool energy shift verifier is configured to verify a tool energy
(Continued)

shift of the DC FEM. The ion implantation system is configured to tune the DC FEM based on the verified tool energy shift, and obtain a peak magnetic field of the DC FEM.

20 Claims, 10 Drawing Sheets

Related U.S. Application Data (60) Provisional application No. 62/712,802, filed on Jul. 31, 2018.

(51) Int. Cl.
*H01L 21/265* (2006.01)
*H01J 37/304* (2006.01)

(56) References Cited

U.S. PATENT DOCUMENTS

| | | | | |
|---|---|---|---|---|
| 10,283,422 | B2* | 5/2019 | Kariya | H01J 37/244 |
| 10,818,473 | B2* | 10/2020 | Lin | H01J 37/3002 |
| 11,264,204 | B2* | 3/2022 | Lin | H01J 37/08 |
| 2008/0245957 | A1* | 10/2008 | Gupta | H01J 37/3171 250/252.1 |
| 2008/0251713 | A1 | 10/2008 | Tsukihara et al. | |
| 2011/0089321 | A1* | 4/2011 | Glavish | H01L 21/26566 250/298 |
| 2015/0136996 | A1 | 5/2015 | Inada et al. | |
| 2015/0162166 | A1* | 6/2015 | Tsai | H01J 37/3171 250/492.21 |
| 2016/0079032 | A1* | 3/2016 | Watanabe | H01J 37/3171 250/492.3 |
| 2018/0145000 | A1* | 5/2018 | Kariya | H01J 37/1474 |
| 2018/0211808 | A1 | 7/2018 | Koo et al. | |
| 2020/0294765 | A1 | 9/2020 | Koo et al. | |

FOREIGN PATENT DOCUMENTS

| | | |
|---|---|---|
| TW | 200845088 A | 11/2008 |
| TW | 201445609 A | 12/2014 |
| TW | 201521073 A | 6/2015 |
| TW | 201611078 A | 3/2016 |
| TW | 201820421 A | 6/2018 |

OTHER PUBLICATIONS

"Spectrum", https://www.merriam-webster.com/dictionary/spectrum. Retrieved Nov. 23, 2020 (Year: 2020).

Johnson, Ronald, and John Schuur. "Understanding the Calibration Methodology for the Axcelis GSD/HE Final Energy Magnet and a Means for Manipulating the Calibration Curve." AIP Conference Proceedings. vol. 866. No. 1. American Institute of Physics, 2006.

Non-Final Office Action issued in U.S. Appl. No. 16/525,071, dated Dec. 2, 2020.

Final Office Action issued in U.S. Appl. No. 16/525,071, dated Feb. 24, 2021.

Notice of Allowance issued in U.S. Appl. No. 16/525,071, dated Jun. 30, 2021.

* cited by examiner

ION IMPLANTATION METHOD AND DEVICE

CROSS-REFERENCE TO RELATED APPLICATION

The present application is a Divisional Application of U.S. application Ser. No. 16/525,071 filed Jul. 29, 2019, now U.S. Pat. No. 11,164,722, which claims priority to U.S. Provisional Application 62/712,802 filed on Jul. 31, 2018, the entire contents of which are incorporated herein by reference.

BACKGROUND

Material properties can be changed, adjusted, or tuned by injecting or implanting an extra species into the material. For example, semiconductors such as silicon can be changed to have higher conductivity by implanting an ion into the silicon. Ion implantation apparatus or ion implanters are widely used for doping (i.e. implanting an ion into) semiconductor wafers with at least one desired species of ions.

Ion implantation depth of wafers by an ion implanter is directly dependent upon the energy of the implanting ion in an ion beam. Therefore, accuracy in achieving desired implantation depth requires accurate control, measurement and monitoring of the energy of the implanting ion. A direct current (DC) final energy magnet (FEM) is used to control the energy of the implanting ion by controlling the strength of the magnetic field. The magnetic field with a tuned magnetic field strength causes the selected ions to travel in an accurate path with a particular momentum.

Unfortunately, calibration of the DC FEM by measuring the energy shift takes at least 12 hours. Thus, there is a demand for a more efficient method of calibration of the DC FEM.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

An ion implantation apparatus or an ion implanter is used to implant at least a species of ion into a material to change the physical property of the material. For example, boron is implanted into silicon to change its electrical property by making the boron doped silicon more conductive such that a p-n junction or a transistor can be made for a complicated circuit of a device. Calibration of an ion implanter requires changing gas cylinders for providing different species of ions for acquiring sufficient number of data points for different ion masses and performing vacuum experiments to obtain sufficient number of data points for plotting a calibration curve. Thus, calibration of an ion implanter requires at least 12 hours. During the data taking for the calibration of the ion implanter, the production process has to be completely stopped. Therefore, an efficient method or apparatus for tuning the ion implanter is demanded, especially when there are more than one ion implanters to be tuned.

Figure 1:
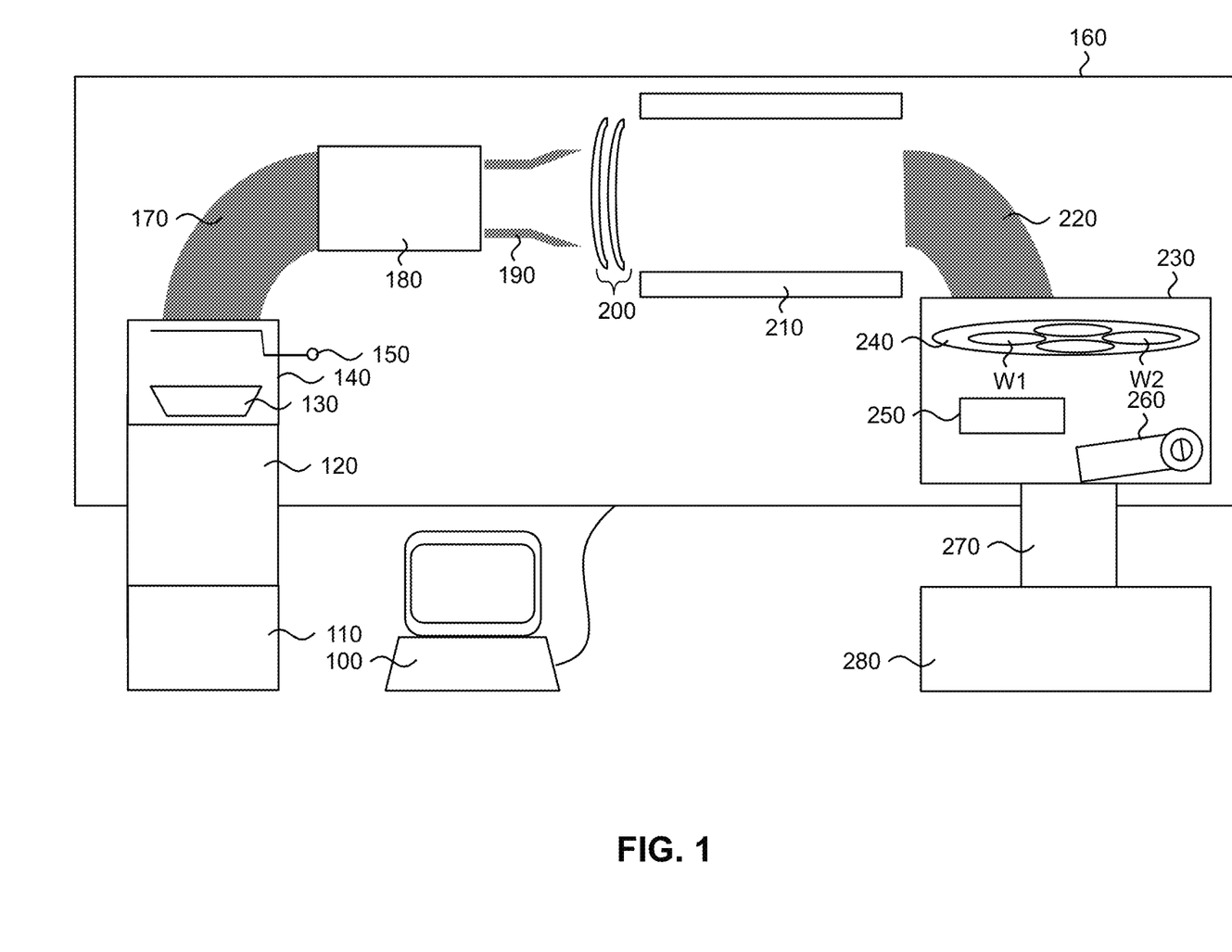
FIG. 1 shows a top plan view of an ion implanter, according to an embodiment of the present disclosure.

FIG. 1 shows a top plan view of an ion implanter, according to an embodiment of the present disclosure. The ion implanter in FIG. 1 is used for medium current type, high current type, and high energy type ion implantations, according to some embodiments of the present disclosure. Medium energy current type ion implantations are mainly used for formation of channels, channel stoppers, and wells. High current type ion implantations are mainly used for formation of sources and drains of transistors or contacts of a device. High energy type ion implantations are mainly used for formation of deep wells and photodiodes. The ion implanter in FIG. 1 is a batch wafer type ion implanter, according to some embodiments of the present disclosure. The ion implanter includes a user interface 100 for inputting the parameters and viewing the data obtained by the ion implanter, according to some embodiments of the present disclosure. The user interface 100 includes a wired or wireless desktop computer, a notebook computer, a tablet, a smartphone, and a remote control device, according to some embodiments of the present disclosure. The user interface 100 includes a display for viewing the data obtained by the ion implanter and for inputting or adjusting parameters of the ion implanter, according to some embodiments of the present disclosure. The display includes a cathode ray tube (CRT) display, liquid crystal display (LCD), light emitting diode (LED), organic light emitting diode (OLED) display, plasma display, and optical projector such as light-bulb projector or laser projection, according to some embodiments of the present disclosure. The user interface 100 includes a data input device, according to some embodiments of the present disclosure. The data input device includes a keyboard, voice command input microphone, iris scanning device, and a facial recognition device, according to some embodiments of the present disclosure. The data input device also includes a cursor control device including a mouse, a touch pad, and a touch screen, according to some embodiments of the present disclosure. The data input device of the user interface 100 is connected to the user interface 100 through electrical wires or wirelessly, according to some embodiments of the present disclosure.

The ion implanter further includes an ion source loading chamber 110 for providing ion source materials for the ion implanter, according to some embodiments of the present disclosure. The ion source material is loaded by opening the chamber 110 and placed on a container 130, according to some embodiments of the present disclosure. The container 130 includes a crucible, according to some embodiments of the present disclosure. Also, the container 130 includes a heater (not shown) for evaporation of the ion source material, according to some embodiments of the present disclosure. The container 130 containing a loaded ion source material is moved through a transition tunnel 120 between the external environment and the internal environment of the ion implantation chamber 160, according to some embodiments of the present disclosure. Then, the container 130 containing the ion source material is positioned inside the arc chamber 140 in which ions for the implanter are formed by heating the ion source material in the container 130 and applying a voltage to an extraction electrode 150 to extract the required ions for the ion implanter, according to some embodiments of the present disclosure.

The generated ion stream passes into a region covered by magnetic field lines of an analyzer magnet 170 and the analyzer magnet 170 selects the appropriate ions based on the desired ion mass and charge by applying and adjusting a magnetic field (and thus by Lorentz force), according to some embodiments of the present disclosure. Only the ions having the desired ion mass and charge can pass into the quadrupole lens (Q lens) region 180, according to some embodiments of the present disclosure. The ion stream then passes into a region surrounded by scanning electrode 190, according to some embodiments of the present disclosure. The scanning electrode 190 uses electrostatic method to uniformly scan the ion beam in a frequency of 100 kHz throughout the area of each of the wafers. The scanning pattern of the scanning electrode 190 depends on the desired outcome of the ion implanted wafers. The scanning electrode 190 includes at least a pair of horizontal electrodes for controlling the horizontal scanning and at least a pair of vertical electrodes for controlling the vertical scanning.

Then the ion stream passes into a region covered by parallel lens 200, according to some embodiments of the present disclosure. The Q lens region 180 and the parallel lens 200 function to shape the ion beam, according to some embodiments of the present disclosure. The scanning electrode 190 functions to scan the ion beam to cover the entire wafer width of the wafer W1, according to some embodiments of the present disclosure.

The ion beam then passes into a region surrounded by an acceleration/deceleration column 210 for adjusting the speed of the ion beam, according to some embodiments of the present disclosure. Then, the ion beam passes into a region covered the magnetic field lines of a final energy magnet (FEM) 220, according to some embodiments of the present disclosure. The FEM 220 functions to adjust the energy of the ions for ion implantation into the wafer W1 located on a rotating disk 240 inside a sample chamber 230, according to some embodiments of the present disclosure. The wafers located on the rotating disk 240 are rotated at a speed so as to allow all the wafers including wafer W2 to face the ions incoming from the FEM 220, according to some embodiments of the present disclosure. If the ion beam misses the wafers and rotation disk 240, the ion beam may continue to pass to impact on beam stopper 250.

The wafers on the rotation disk 240, e.g. W1 and W2, are loaded on a container (not shown) in a wafer loading chamber 280. Then, the wafer is carried through a transition tunnel 270 between the external environment of the ion implanter and the internal environment of the ion implanter. The transition tunnel 270 includes a valve or door (not shown) for prevention of contamination, according to some embodiments of the present disclosure. The wafers are then carried into a wafer chamber 230 and are loaded onto the rotating disk 240 by a robotic arm 260, according to some embodiments of the present disclosure. The rotating disk 240 does not rotate when the wafers are loaded onto the rotating disk 240, according to some embodiments of the present disclosure.

Figure 2:
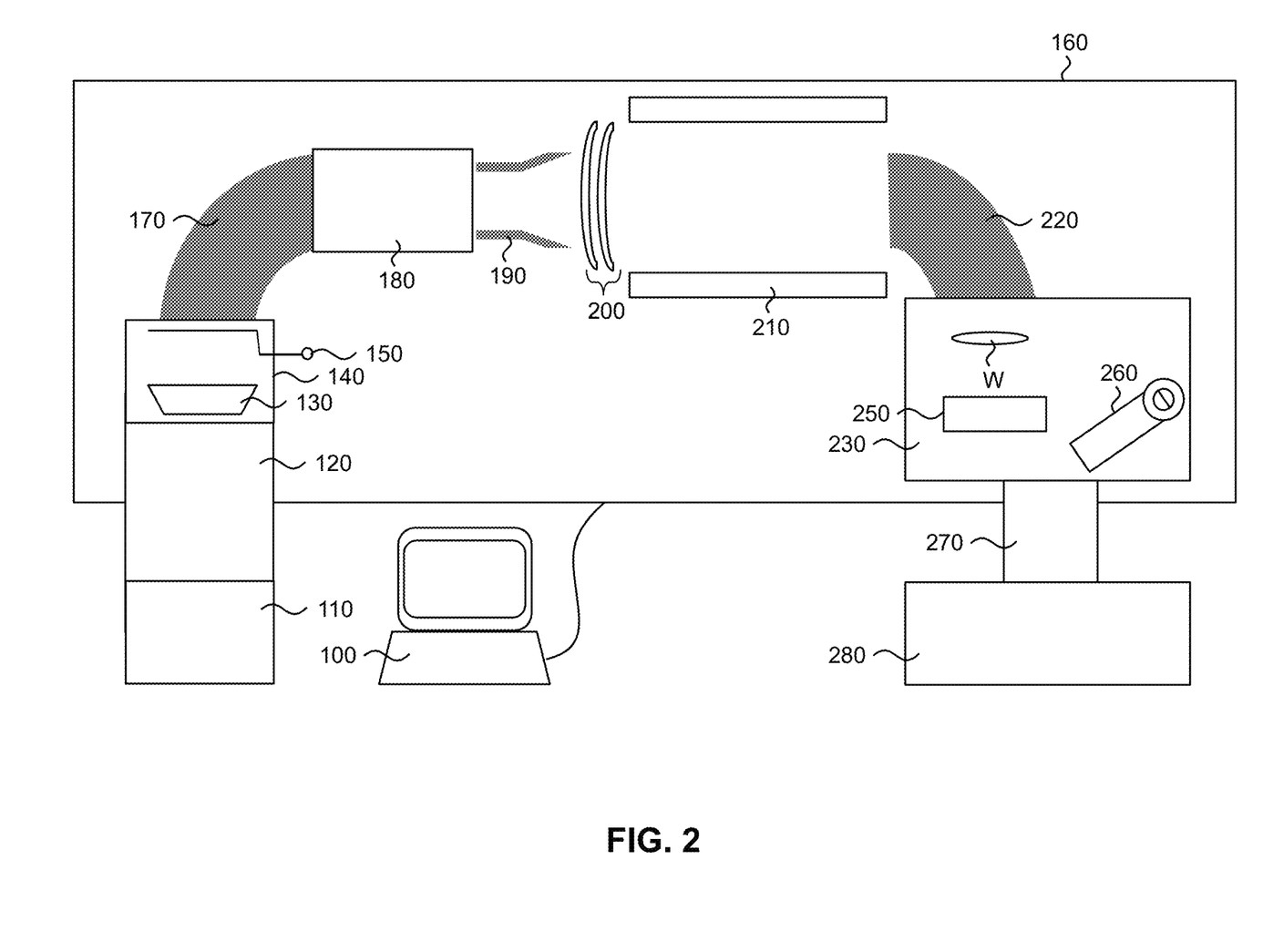
FIG. 2 shows a top plan view of an ion implanter, according to another embodiment of the present disclosure.

FIG. 2 shows a top plan view of an ion implanter, according to another embodiment of the present disclosure. FIG. 2 shows a top plan view of an ion implanter, according to an embodiment of the present disclosure. The ion implanter in FIG. 2 is used for medium current type, high current type, and high energy type ion implantations, according to some embodiments of the present disclosure. Medium energy current type ion implantations are mainly used for formation of channels, channel stoppers, and wells. High current type ion implantations are mainly used for formation of sources and drains of transistors or contacts of a device. High energy type ion implantations are mainly used for formation of deep wells and photodiodes. The ion implanter in FIG. 2 is a batch wafer type ion implanter, according to some embodiments of the present disclosure. The ion implanter includes a user interface 100 for inputting the parameters and viewing the data obtained by the ion implanter, according to some embodiments of the present disclosure. The user interface 100 includes a wired or wireless desktop computer, a notebook computer, a tablet, a smartphone, and a remote control device, according to some embodiments of the present disclosure. The user interface 100 includes a display for viewing the data obtained by the ion implanter and for inputting or adjusting parameters of the ion implanter, according to some embodiments of the present disclosure. The display includes a cathode ray tube (CRT) display, liquid crystal display (LCD), light emitting diode (LED), organic light emitting diode (OLED) display, plasma display, and optical projector such as light-bulb projector or laser projection, according to some embodiments of the present disclosure. The user interface 100 includes a data input device, according to some embodiments of the present disclosure. The data input device includes a keyboard, voice command input microphone, iris scanning device, and a facial recognition device, according to some embodiments of the present disclosure. The data input device also includes a cursor control device including a mouse, a touch pad, and a touch screen, according to some embodiments of the present disclosure. The data input device of the user interface 100 is connected to the user interface 100 through electrical wires or wirelessly, according to some embodiments of the present disclosure.

The ion implanter further includes an ion source loading chamber 110 for providing ion source materials for the ion implanter, according to some embodiments of the present disclosure. The ion source material is loaded by opening the ion source loading chamber 110 and placed on a container 130, according to some embodiments of the present disclosure. The container 130 includes a crucible, according to some embodiments of the present disclosure. Also, the container 130 includes a heater (not shown) for evaporation of the ion source material, according to some embodiments of the present disclosure. The container 130 containing a loaded ion source material is moved through a transition tunnel 120 between the external environment and the internal environment of the ion implantation chamber 160, according to some embodiments of the present disclosure. Then, the container 130 containing the ion source material is positioned inside the arc chamber 140 in which ions for the implanter are formed by heating the ion source material in the container 130 and applying a voltage to an extraction electrode 150 to extract the required ions for the ion implanter, according to some embodiments of the present disclosure.

The generated ion stream passes into a region covered by magnetic field lines of an analyzer magnet 170 and the analyzer magnet 170 selects the appropriate ions based on the desired ion mass and charge by applying and adjusting a magnetic field (and thus by Lorentz force), according to some embodiments of the present disclosure. Only the ions having the desired ion mass and charge can pass into the quadrupole lens (Q lens) region 180, according to some embodiments of the present disclosure. The ion stream then passes into a region surrounded by scanning electrode 190, according to some embodiments of the present disclosure. The scanning electrode 190 uses electrostatic method to uniformly scan the ion beam in a frequency of 100 kHz throughout the area of each of the wafers. The scanning pattern of the scanning electrode 190 depends on the desired outcome of the ion implanted wafers. The scanning electrode 190 includes at least a pair of horizontal electrodes for controlling the horizontal scanning and at least a pair of vertical electrodes for controlling the vertical scanning.

Then the ion stream passes into a region covered by parallel lens 200, according to some embodiments of the present disclosure. The Q lens region 180 and the parallel lens 200 function to shape the ion beam, according to some embodiments of the present disclosure. The scanning electrode 190 functions to scan the ion beam to cover the entire wafer width of the wafer W, according to some embodiments of the present disclosure.

The ion beam then passes into a region surrounded by an acceleration/deceleration column 210 for adjusting the speed of the ion beam, according to some embodiments of the present disclosure. Then, the ion beam passes into a region covered the magnetic field lines of a final energy magnet (FEM) 220, according to some embodiments of the present disclosure. The FEM 220 functions to adjust the energy of the ions for ion implantation into the wafer W located inside a sample chamber 230, according to some embodiments of the present disclosure. The position of the wafer W is maintained during the ion implantation, according to some embodiments of the present disclosure. If the ion beam misses the wafer W may continue to pass to impact on beam stopper 250.

The wafer W is located on a container (not shown) in a wafer loading chamber 280. Then, the wafer is carried through a transition tunnel 270 between the external environment of the ion implanter and the internal environment of the ion implanter. The transition tunnel 270 includes a valve or door (not shown) for prevention of contamination, according to some embodiments of the present disclosure. The wafers are then carried into a wafer chamber 230 by a robotic arm 260, according to some embodiments of the present disclosure.

Figure 3:
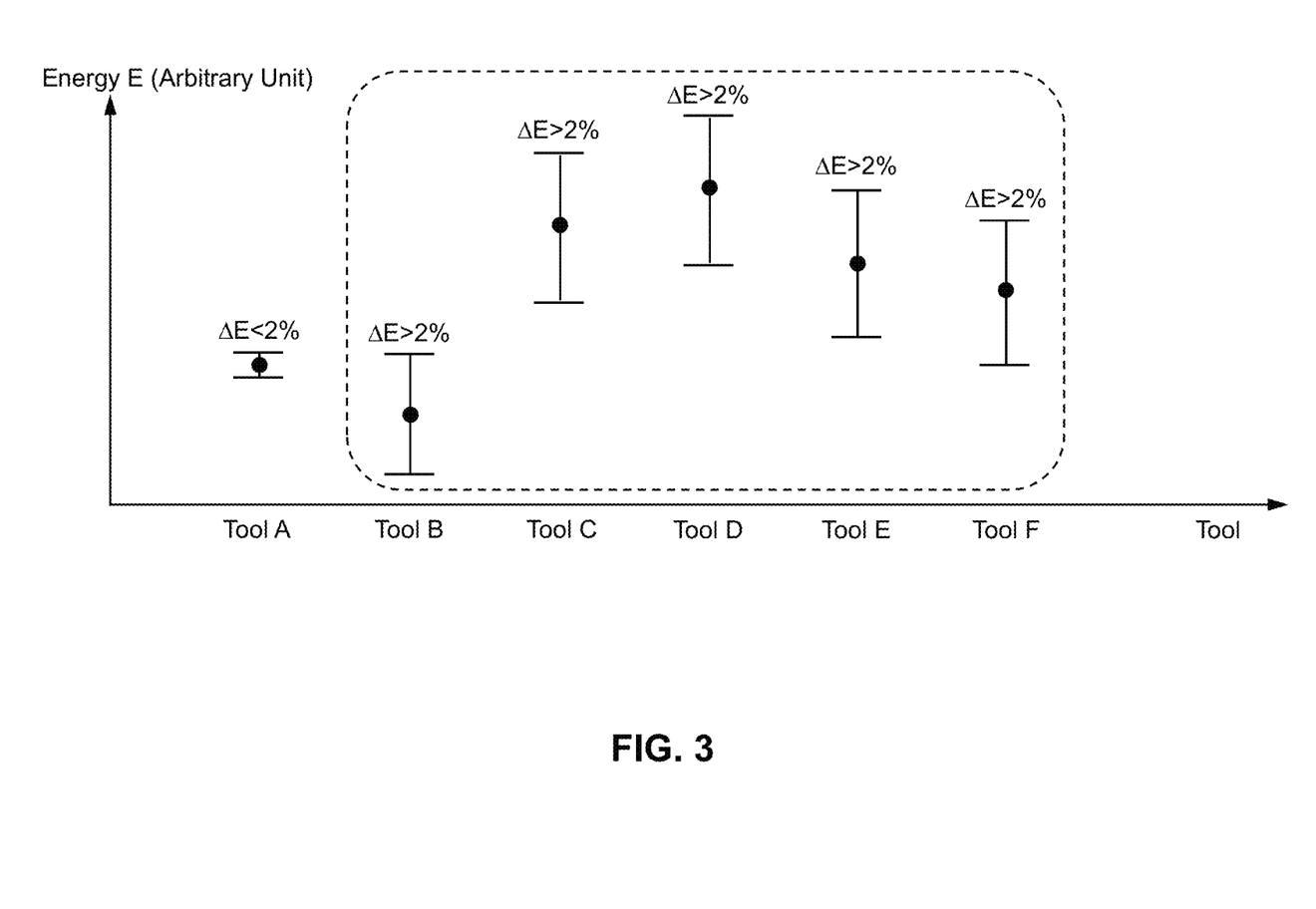
FIG. 3 shows a graph of tool (x-axis) versus energy E (y-axis), indicating variation of energy ΔE obtained from the final energy magnet (FEM) of various ion implanters (i.e. tools A, B, C, D, E, and F), according to some embodiments of the present disclosure.

FIG. 3 shows a graph of tool (x-axis) versus energy E (y-axis), indicating variation of energy ΔE obtained from the final energy magnet (FEM) of various ion implanters (i.e. tools A, B, C, D, E, and F), according to some embodiments of the present disclosure. FIG. 3 shows the energy data points measured for various ion implanters (i.e. tools A, B, C, D, E, and F). For each of the tools, e.g. tool A, numerous data points are taken and the error bars are averaged values over the data points, indicating the energy shift ΔE of less than 2%. Tools B, C, D, E, and F have energy shift ΔE greater than 2%. Only tool A is measured to have energy shift ΔE less than 2%. For an ion implanter to properly function to produce accurate products, the energy shift ΔE is preferably to be less than 2%. For an energy shift ΔE larger than 2%, the depth of the ion implantation and the dose cannot be accurately controlled and the products produced by the ion implanter would be defective or having quality deviated from the quality desired by customers.

When a user applies a magnetic field in the FEM 220, the user inputs the parameters to achieve the desired energy based on the equation of ion electromagnetic rigidity ρ, i.e.

$$\rho = Br \qquad \text{Eq. (1)}$$

where B is the applied magnetic field and r is the radius of trajectory of the ion beam. The generated magnetic field B is always not the same as the desired applied magnetic field. Therefore, a shift of magnetic field ΔB occurs. This shift of magnetic field ΔB causes the generated magnetic field from the FEM 220 to be different from the desired applied magnetic field and the energy of the ions outgoing from the FEM 220 would not be the same as the desired value. Thus, an energy shift ΔE occurs. This energy shift ΔE is required to be corrected so as to achieve an accurate energy value of the implanted ions.

Figure 4:
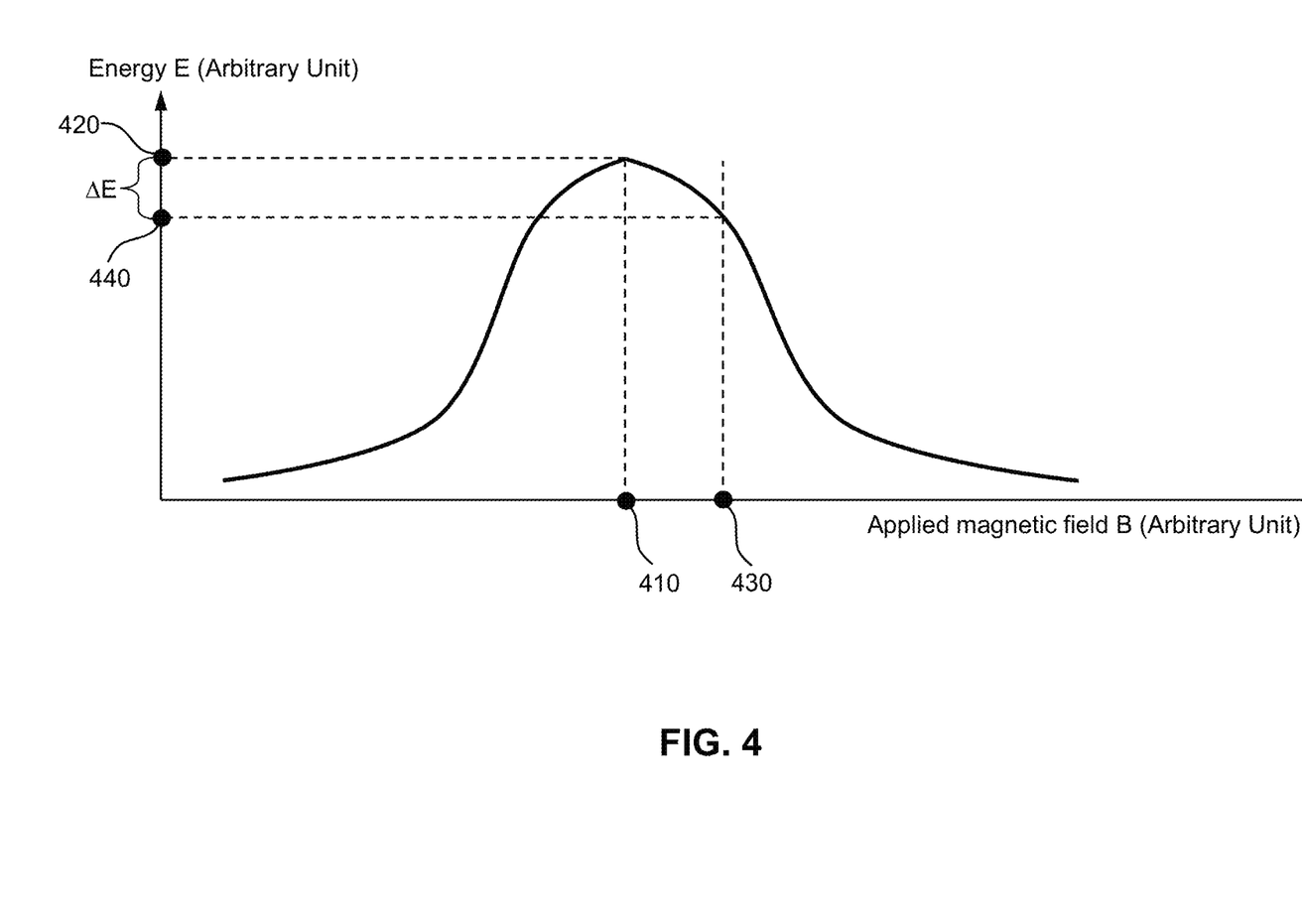
FIG. 4 shows a graph of applied magnetic field B (x-axis) versus energy E (y-axis), indicating variation of energy ΔE, according to some embodiments of the present disclosure.

FIG. 4 shows a graph of applied magnetic field B (x axis) versus ion energy E (y axis). In the graph, a calibration curve is shown and the curve indicates the relationship between the measured magnetic field B by a magnetic field probe positioned at the central region of the FEM 220 and the ion energy E obtained by measuring the radius of curvature r of the ion trajectory and the implanted depth and coverage, according to some embodiments of the present disclosure. When a user operates an ion implanter, the user inputs the parameters to control the applied magnetic field at a value at point 410 and expects to obtain the desired implantation energy 420. However, the actual applied magnetic field measured by a magnetic field probe positioned at the central region of the FEM 220 is a value at point 430 due to an energy shift ΔE and the ion energy is thus lowered to point 440. Therefore, it may be necessary to control the energy of the ions to have an energy shift ΔE less than 2% and one of the methods to control the energy is by controlling the FEM 220, according to some embodiments of the present disclosure.

Figure 5:
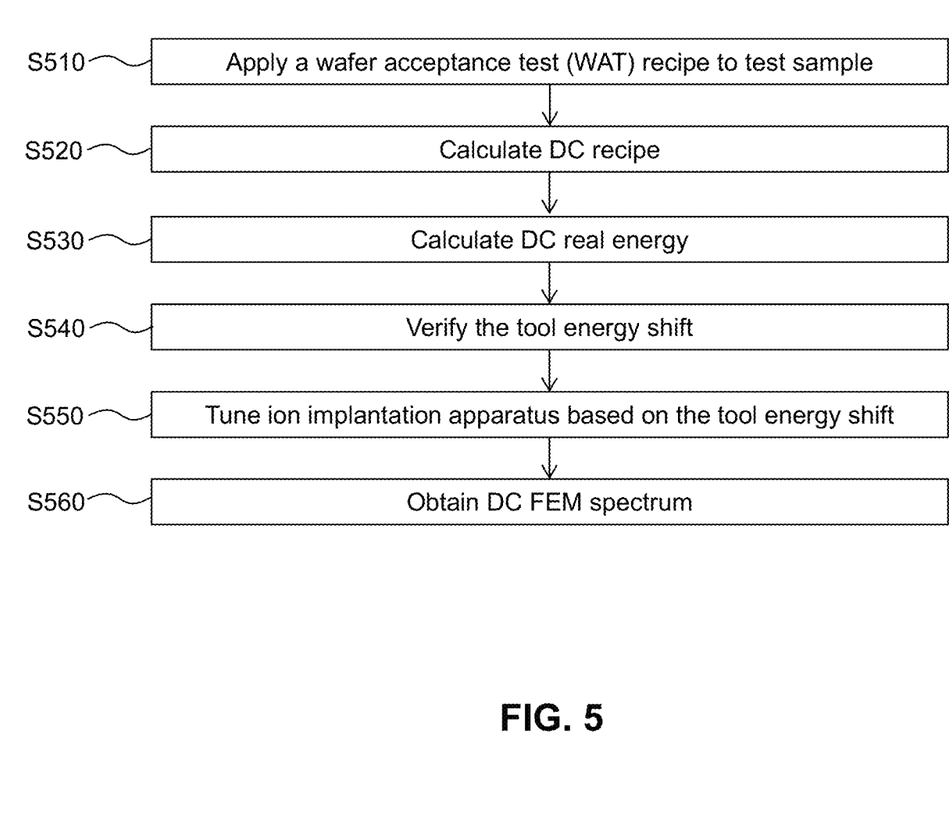
FIG. 5 shows a flow chart of operations for calibration of the FEM, according to an embodiment of the present disclosure.

FIG. 5 shows a sequential process for calibrating the ion implantation apparatus, according to an embodiment of the present disclosure. It is understood that additional operations can be provided before, during, and after processes shown by FIG. 5, and some of the operations described below can be replaced or eliminated, for additional embodiments of the method. The order of the operations/processes may be interchangeable.

FIG. 5 shows a flow chart of operations of a method for calibration of the FEM 220, according to an embodiment of the present disclosure. In the method, an operation S510 is carried out to apply a wafer acceptance test (WAT) recipe to test the sample wafer W1 after a test run of ion implantation, according to some embodiments of the present disclosure. The purpose of the WAT is to determine the ion trajectory radius, implantation coverage, and the actually applied magnetic field $B_{actual}$, according to some embodiments of the present disclosure. The actually applied magnetic field $B_{actual}$ can be used to determine the actual ion energy $E_{actual}$, according to some embodiments of the present disclosure. With the values of the ion trajectory radius, implantation coverage, and the actually applied magnetic field $B_{actual}$ determined, operation S520 is carried out to calculate the DC recipe, i.e. the nominal parameters of the DC FEM 220 in the event of ion implantation of the sample W1 subjected to WAT, according to some embodiments of the present disclosure. Based on the calculated DC recipe, the nominal applied magnetic field $B_{nominal}$ is calculated. In this way, the nominal ion energy $E_{nominal}$ is calculated. Then, an operation S530 is carried out to calculate the actual ion energy $E_{actual}$ based on the results of the WAT of the sample wafer W1, e.g. the actually applied magnetic field $B_{actual}$. Then, an operation S540 is carried out to verify the tool energy shift ΔE (i.e. $|E_{actual}-E_{nominal}|$). Then, an operation S550 is carried out to tune the ion implantation apparatus using the tool energy shift ΔE. Then, an operation S560 is carried out to obtain the spectrum of the DC FEM 220.

Figure 6:
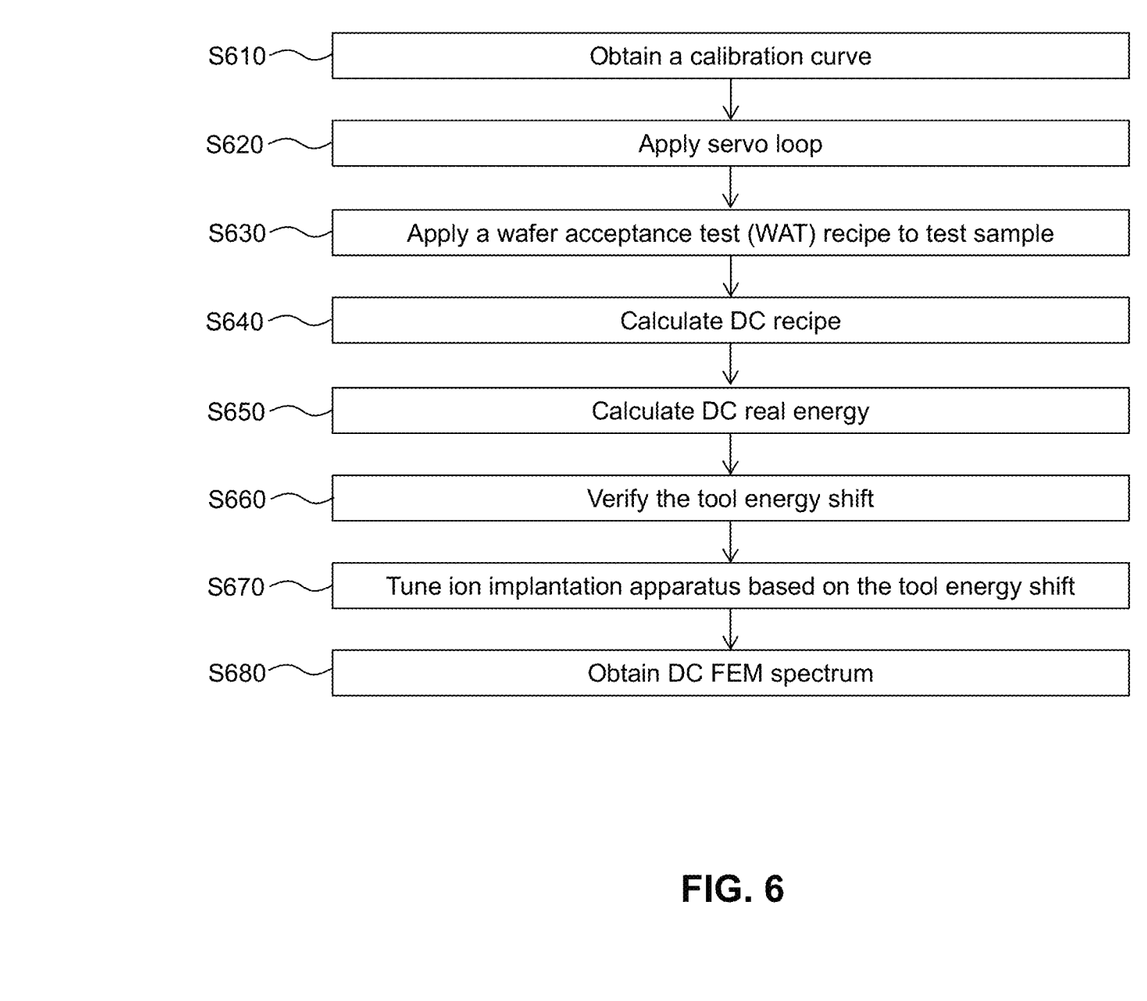
FIG. 6 shows a flow chart of operations for calibration of the FEM, according to another embodiment of the present disclosure.

FIG. 6 shows a sequential process for calibrating the ion implantation apparatus, according to an embodiment of the present disclosure. It is understood that additional operations can be provided before, during, and after processes shown by FIG. 6, and some of the operations described below can be replaced or eliminated, for additional embodiments of the method. The order of the operations/processes may be interchangeable. FIG. 6 shows a flow chart of operations of a method for calibration of the FEM 220, according to an embodiment of the present disclosure. In the method, a calibration curve (with ion energy E being the y axis and the applied magnetic field B being the x axis) is obtained in an operation S610, according to some embodiments of the present disclosure. The operation is carried out by running test implantation using various species of gas of different ion masses, e.g. boron and xenon. The actually applied magnetic field B is measured by magnetic field probe positioned at the central region of the FEM 220, according to some embodiments of the present disclosure. The actual ion energy E is measured by examining sample wafers during the test runs of the ion implantation. Then, an operation S620 is carried out to apply a servo loop to adjust the FEM 220 based on the calibration curve obtained in the operation S610. Then, a test run on a sample wafer W1 is obtained and an operation S630 is carried out to apply a wafer acceptance test (WAT) recipe to test the sample wafer W1 after a test run of ion implantation, according to some embodiments of the present disclosure. The purpose of the WAT is to determine the ion trajectory radius, implantation coverage, and the actually applied magnetic field $B_{actual}$, according to some embodiments of the present disclosure. The actually applied magnetic field $B_{actual}$ can be used to determine the actual ion energy $E_{actual}$, for example, using the calibration curve obtained from the operation S610, according to some embodiments of the present disclosure. With the values of the ion trajectory radius, implantation coverage, and the actually applied magnetic field $B_{actual}$ determined, operation S640 is carried out to calculate the DC recipe, i.e. the nominal parameters of the DC FEM 220 in the event of ion implantation of the sample W1 subjected to WAT, according to some embodiments of the present disclosure. Based on the calculated DC recipe, the nominal applied magnetic field $B_{nominal}$ is calculated. In this way, the nominal ion energy $E_{nominal}$ is calculated, for example, using the calibration curve obtained from the operation S610. Then, an operation S650 is carried out to calculate the actual ion energy $E_{actual}$ based on the results of the WAT of the sample wafer W1, e.g. the actually applied magnetic field $B_{actual}$. Then, an operation S660 is carried out to verify the tool energy shift ΔE (i.e. $|E_{actual}-E_{nominal}|$). Then, an operation S670 is carried out to tune the ion implantation apparatus using the tool energy shift ΔE. Then, an operation S680 is carried out to obtain the spectrum of the DC FEM 220.

Figure 7:
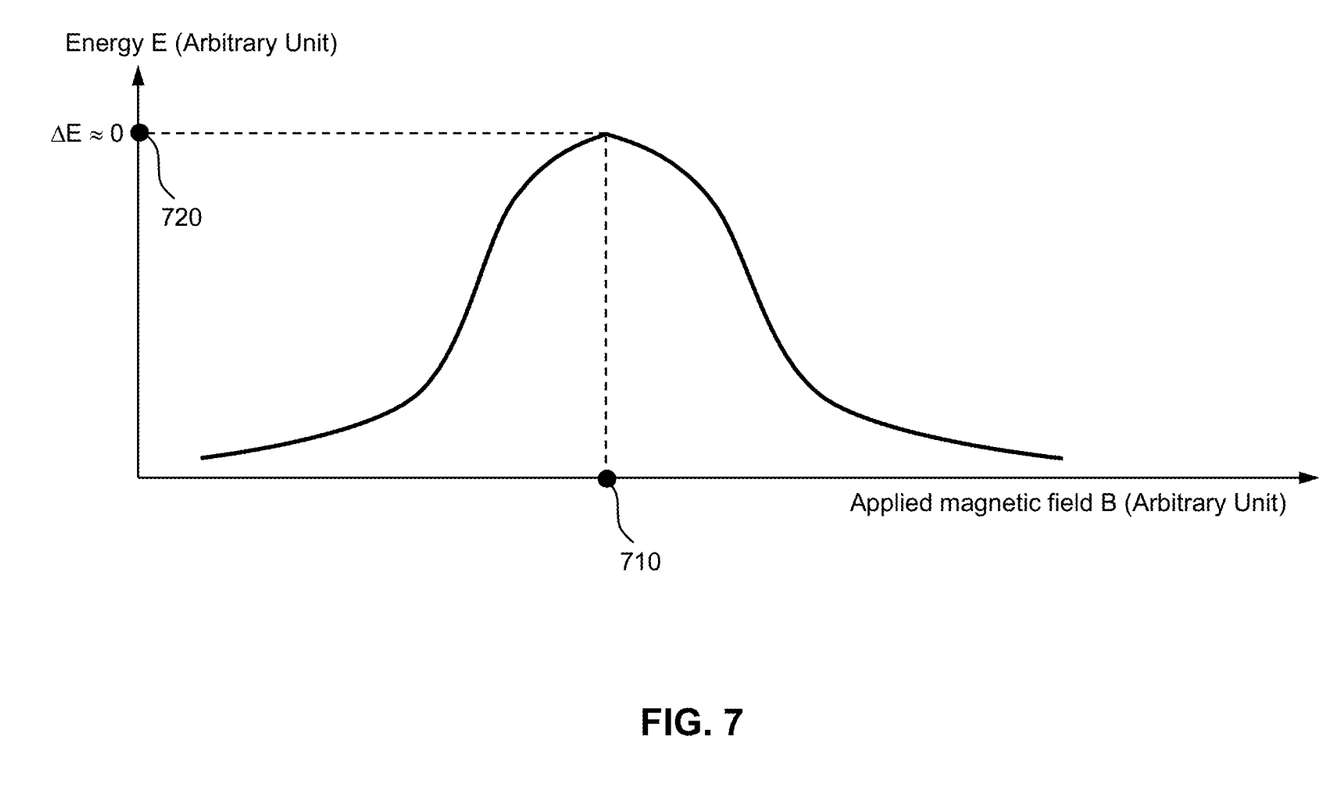
FIG. 7 shows a graph of applied magnetic field B (x-axis) versus energy E (y-axis), indicating variation of energy ΔE after carrying out the operations of FIG. 5 or FIG. 6, according to some embodiments of the present disclosure.

FIG. 7 shows a graph of applied magnetic field B (x axis) versus ion energy E (y axis) after the operations of FIG. 5 or FIG. 6. In the graph, a calibration curve of applied magnetic field B (x axis) versus ion energy E (y axis) is shown and the curve indicates the relationship between the applied magnetic field B measured by a magnetic field probe positioned at the central region of the FEM 220 and the ion energy E obtained by measuring the radius of curvature r of the ion trajectory and the implanted depth and coverage, according to some embodiments of the present disclosure. When a user operates the tuned ion implanter, the user inputs the parameters to control the applied magnetic field at a value at point 710 and expects to obtain the desired implantation energy at point 720. In the ion implanter tuned by using the operations of FIG. 5 or 6, the actual applied magnetic field measured by a magnetic field probe positioned at the central region of the FEM 220 is a value at point 710 due to the fact that the energy shift ΔE becomes nearly zero or less than 2% and the ion energy is thus not lowered and is at point 720. Therefore, through operations of FIG. 5 or 6, the ion implanted is tuned to have an energy shift ΔE less than 2% and the tuned ion implanter produces accurate product with controllable ion implantation depth and dose.

Figure 8:
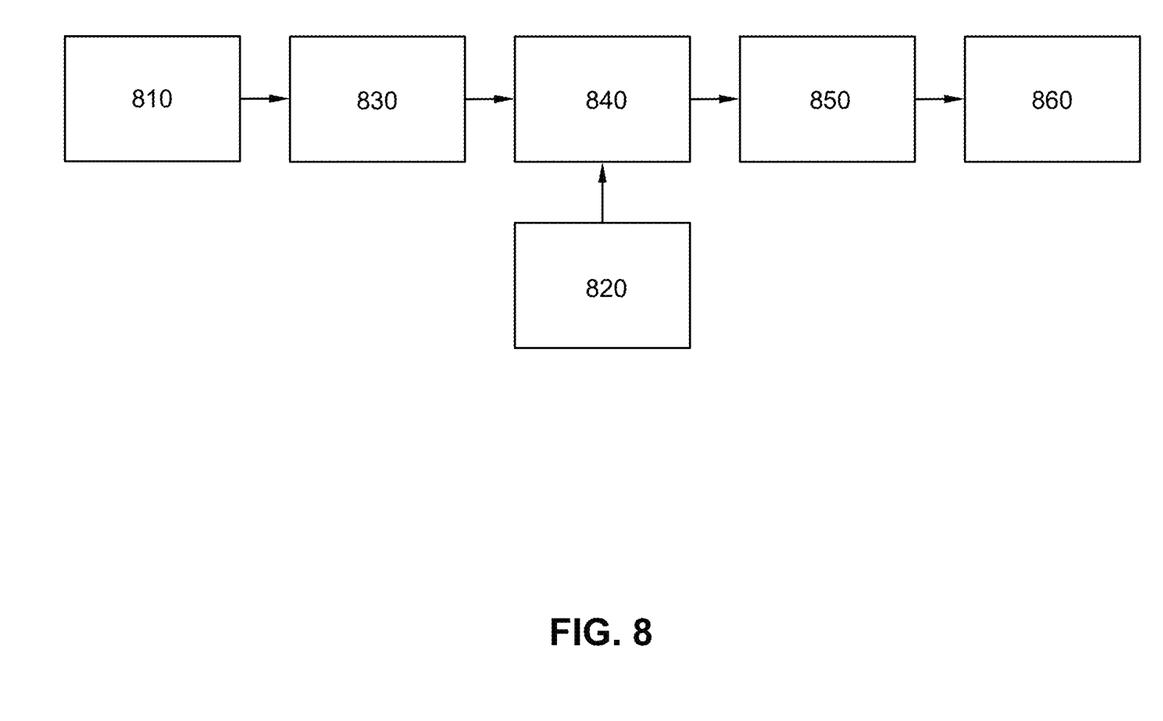
FIG. 8 shows a calibration unit of the FEM, according to an embodiment of the present disclosure.

FIG. 8 shows a calibration unit of the FEM 220, according to some embodiments of the present disclosure. In FIG. 8, a wafer acceptance test (WAT) instrument 810 is operated to test the wafer W1 to obtain the radius of trajectory of the ion beam, ion implantation coverage, and ion implantation depth. The WAT instrument 810 is a hardware machine to test the sample wafer W1 by using optical or tunneling electron method to measure the ion implantation depth, estimated implantation energy, radius of trajectory of ions, etc., according to some embodiments of the present disclosure. The WAT instrument 810 calculates the applied magnetic field using Eq. (1) based on the radius of trajectory and the ion electromagnetic rigidity, according to some embodiments of the present disclosure. Then, the data resulted from the WAT instrument 810 is transferred to a DC real energy calculator 830 to calculate the actual ion energy, according to some embodiments of the present disclosure. In some embodiments, the DC real energy calculator 830 includes a calibration curve. The DC real energy calculator 830 includes hardware component such as processor for performing the function of calculation, according to some embodiments of the present disclosure. Then, the data resulted from the DC real energy calculator 830 are transferred to the tool energy shift verifier 840, according to some embodiments of the present disclosure. A DC recipe calculator 820 functions to perform calculation of nominal applied magnetic field based on the parameters inputted to the ion implanter by the user, according to some embodiments of the present disclosure. The DC recipe calculator 820 includes hardware component such as processor for performing the function of calculation, according to some embodiments of the present disclosure. Then, the data resulted from the DC recipe calculator 820 are transferred to the tool energy shift verifier 840, according to some embodiments of the present disclosure. The tool energy shift verifier 840 then calculates the energy shift based on the results obtained from the DC recipe calculator 820 and DC real energy calculator 830, according to some embodiments of the present disclosure. Then, the tool energy shift verifier 840 outputs result to the ion implantation apparatus tuning unit 850 which tune the parameters of the ion implanter by, for example, increase/decrease the parameters inputted by the user after the user inputs the parameters, according to some embodiments of the present disclosure. Then, ion implantation apparatus tuning unit 850 outputs the results to the DC FEM spectrum generator 860 to generate a spectrum of FEM 220. The magnetic spectrum of the FEM 220 accurately adjusts the ion energy to the user-desired value.

Figure 9:
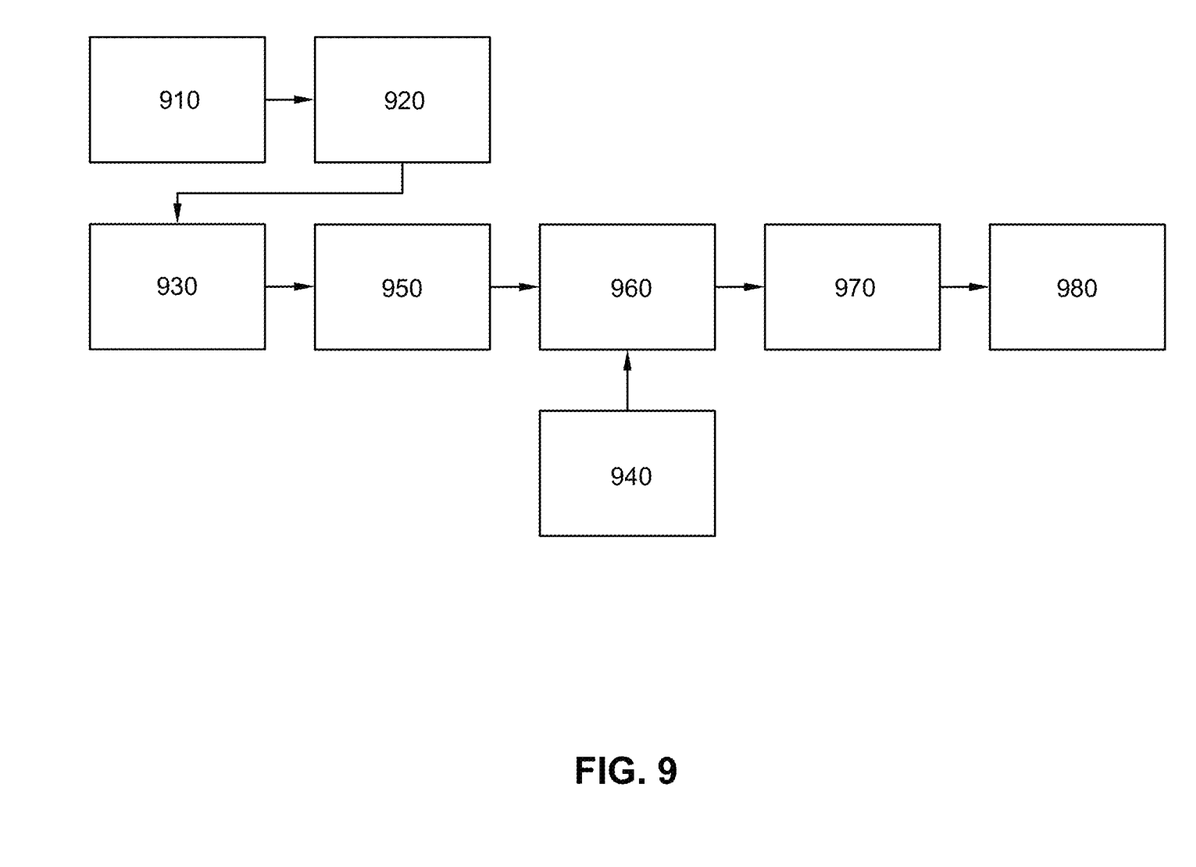
FIG. 9 shows a calibration unit of the FEM, according to another embodiment of the present disclosure.

FIG. 9 shows a calibration unit of the FEM 220, according to some embodiments of the present disclosure. In FIG. 9, a calibration curve obtaining unit 910 functions to obtain a calibration curve of applied magnetic field (x axis) versus ion energy (y axis). The calibration curve obtaining unit 910 functions to run test implantation using various species of gas of different ion masses, e.g. boron and xenon. The calibration curve obtaining unit 910 includes hardware component such as a magnetic field probe and a processor. The actually applied magnetic field B is measured magnetic field probe positioned at the central region of the FEM 220, according to some embodiments of the present disclosure. The actual ion energy E is measured by examining sample wafers during the test runs of the ion implantation. The calibration curve obtaining unit 910 then outputs the result to servo loop unit 920. The servo loop unit 920 functions to adjust the FEM 220 using a servo loop to adjust the parameters based on the calibration curve obtained from the calibration curve obtaining unit 910. The servo loop unit 920 includes hardware component such as processor to control the parameters of the FEM 220. The servo loop unit 920 then outputs the calibration curve and the parameters obtained from the servo loop operation to a wafer acceptance test (WAT) instrument 930. The units and operations 930-980 of FIG. 9 are the same as or similar to the units and operations 810-860 of FIG. 8. The WAT instrument 930 is operated to test the wafer W1 to obtain the radius of trajectory of the ion beam, ion implantation coverage, and ion implantation depth. The WAT instrument 930 is a hardware machine to test the sample wafer W1 by using optical or tunneling electron method to measure the ion implantation depth, estimated implantation energy, radius of trajectory of ions, etc., according to some embodiments of the present disclosure. The WAT instrument 930 calculates the applied magnetic field using Eq. (1) based on the radius of trajectory and the ion electromagnetic rigidity, according to some embodiments of the present disclosure. Then, the data resulted from the WAT instrument 930 is transferred to the DC real energy calculator 950 to calculate the actual ion energy, according to some embodiments of the present disclosure. In some embodiments, the DC real energy calculator 950 includes a calibration curve. The DC real energy calculator 950 includes hardware component such as processor for performing the function of calculation, according to some embodiments of the present disclosure. Then, the data resulted from the DC real energy calculator 950 are transferred to the tool energy shift verifier 960, according to some embodiments of the present disclosure. A DC recipe calculator 940 functions to perform calculation of nominal applied magnetic field based on the parameters inputted to the ion implanter by the user, according to some embodiments of the present disclosure. The DC recipe calculator 940 includes hardware component such as processor for performing the function of calculation, according to some embodiments of the present disclosure. Then, the data resulted from the DC recipe calculator 940 are transferred to the tool energy shift verifier 960, according to some embodiments of the present disclosure. The tool energy shift verifier 960 then calculates the energy shift based on the results obtained from the DC recipe calculator 940 and DC real energy calculator 950, according to some embodiments of the present disclosure. Then, the tool energy shift verifier 960 outputs result to the ion implantation apparatus tuning unit 970 which tune the parameters of the ion implanter by, for example, increase/decrease the parameters inputted by the user after the user inputs the parameters, according to some embodiments of the present disclosure. Then, ion implantation apparatus tuning unit 970 outputs the results to the DC FEM spectrum generator 980 to generate a spectrum of FEM 220. The magnetic spectrum of the FEM 220 accurately adjusts the ion energy to the user-desired value.

Figure 10:
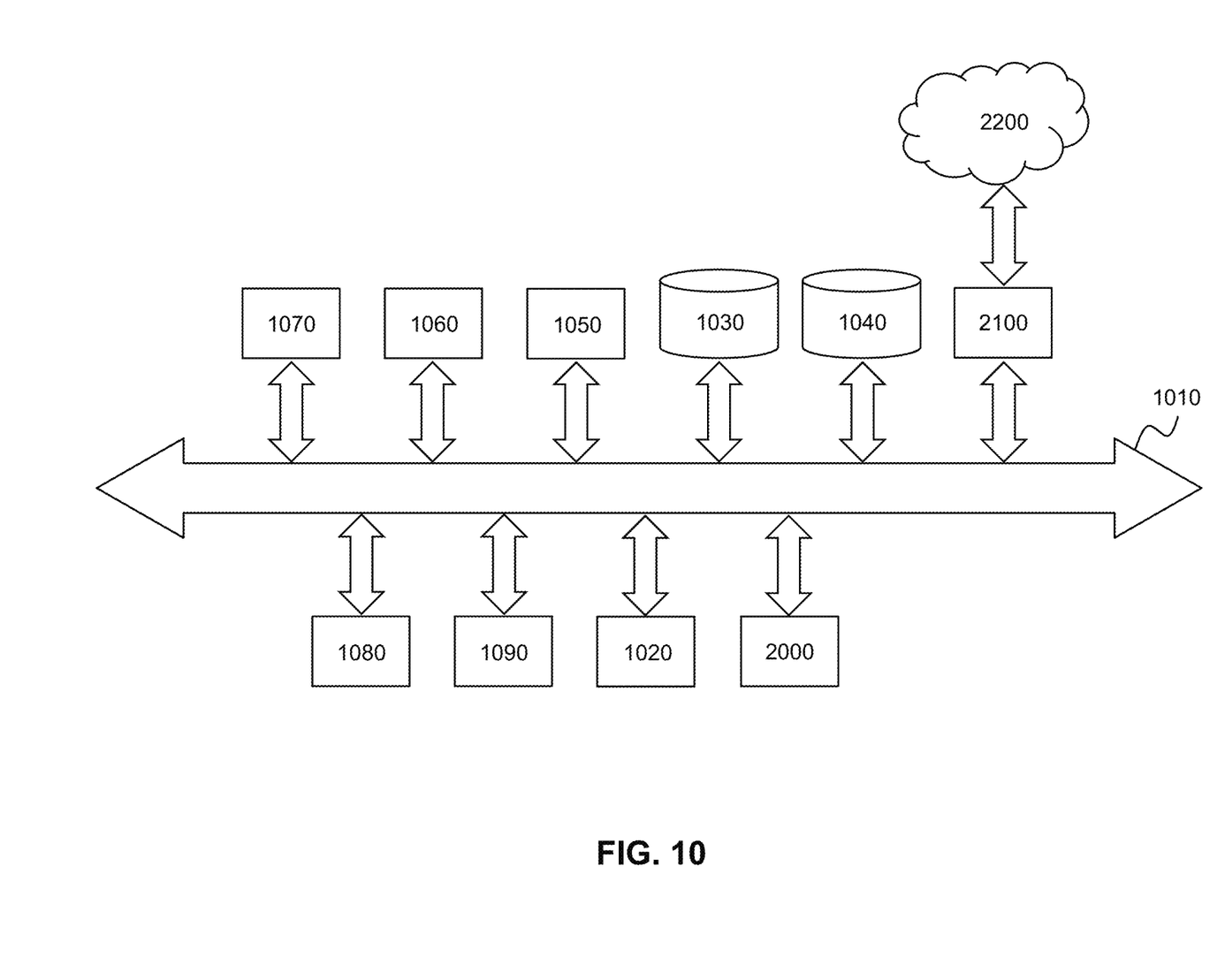
FIG. 10 shows a computer hardware diagram of an ion implantation apparatus, according to some embodiments of the present disclosure.

FIG. 10 shows a computer hardware diagram of an ion implantation apparatus, according to some embodiments of the present disclosure. As schematically shown in FIG. 10, a generic computer of the ion implanter, e.g. the computer 100 (FIGS. 1 and 2), includes several functional units connected in parallel to a data communication bus 1010, for example of the PCI type. In particular, a Central Processing Unit (CPU) 1020, typically comprising a microprocessor, controls the operation of the computer 100, a working memory 1030, typically a RAM (Random Access Memory) is directly exploited by the CPU 1020 for the execution of programs and for temporary storage of data, and a Read Only Memory (ROM) 1040 stores a basic program for the bootstrap of the computer 100. The computer 100 comprises several peripheral units, connected to the bus 1010 by means of respective interfaces. Particularly, the peripheral units that allow the interaction with a human user are provided, such as a display device 1050 (for example a cathode ray tube (CRT), a liquid crystal display (LCD), a light emitting diode (LED) display, an organic light emitting diode (OLED) display, or a plasma monitor), a keyboard 1060 and a pointing device 1070 (for example a mouse or a trackpoint). The computer 100 also includes peripheral units for local mass-storage of programs (operating system, application programs) and data, such as one or more magnetic Hard-Disk Drivers (HDD) 1080 driving magnetic hard disks, a memory card reader 1090, and a CD-ROM/DVD driver 2000, or a CD-ROM/DVD juke-box, for reading/writing CD-ROMs/DVDs. Other peripheral units may be present, such as a floppy-disk driver for reading/writing floppy disks, a memory card reader for reading/writing memory cards and the like. The computer 100 is further equipped with a Network Interface Adapter (NIA) card 2100 for the connection to the data communication network 2200 such as internet; alternatively, the computer 100 may be connected to the data communication network 2200 by means of a MODEM.

The system, method, computer program product, and propagated signal described in the present disclosure may, of course, be embodied in hardware; e.g., within or coupled to a Central Processing Unit ("CPU"), microprocessor, microcontroller, System on Chip ("SOC"), or any other programmable device. Additionally, the system, method, computer program product, and propagated signal may be embodied in software (e.g., computer readable code, program code, instructions and/or data disposed in any form, such as source, object or machine language) disposed, for example, in a computer usable (e.g., readable) medium configured to store the software. Such software enables the function, fabrication, modeling, simulation, description and/or testing of the apparatus and processes described herein. For example, this can be accomplished through the use of general programming languages (e.g., C, C++), GDSII databases, hardware description languages (HDL) including Verilog HDL, VHDL, AHDL (Altera HDL) and so on, or other available programs, databases, nanoprocessing, and/or circuit (i.e., schematic) capture tools. Such software can be disposed in any known computer usable medium including semiconductor, magnetic disk, optical disc (e.g., CD-ROM, DVD-ROM, etc.) and as a computer data signal embodied in a computer usable (e.g., readable) transmission medium (e.g., carrier wave or any other medium including digital, optical, or analog-based medium). As such, the software can be transmitted over communication networks including the Internet and intranets. A system, method, computer program product, and propagated signal embodied in software may be included in a semiconductor intellectual property core (e.g., embodied in HDL) and transformed to hardware in the production of integrated circuits. Additionally, a system, method, computer program product, and propagated signal as described herein may be embodied as a combination of hardware and software.

Any suitable programming language can be used to implement the routines of the present invention including C, C++, Java, assembly language, etc. Different programming techniques can be employed such as procedural or object oriented. The routines can execute on a single processing device or multiple processors. Although the steps, operations or computations may be presented in a specific order, this order may be changed in different embodiments. In some embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A "computer-readable medium" for purposes of embodiments of the present invention may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. Distributed, or networked systems, components and circuits can be used.

Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application.

It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated.

Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Using the above mentioned methods, e.g. in FIGS. 5 and 6, the calibration of the FEM 220 involves mostly computer calculation without the need to change gas cylinders for performing numerous laborious experiments to obtain a graph of calibration curve. The calibration methods thus reduce the time needed for calibration of ion implantation apparatus, especially when there are numerous ion implantation apparatus that needed to be calibrated.

It will be understood that not all advantages have been necessarily discussed herein, no particular advantage is required for all embodiments or examples, and other embodiments or examples may offer different advantages.

According to some embodiments of the present disclosure, a method of tuning an ion implantation apparatus is disclosed. The method includes an operation of applying a wafer acceptance test (WAT) recipe to a test sample. An operation of calculating a recipe for a direct current (DC) final energy magnet (FEM). An operation of calculating a real energy of the DC FEM. An operation of verifying a tool energy shift. An operation of tuning the ion implantation apparatus based on the verified tool energy shift. An operation of obtaining a magnetic spectrum of the DC FEM. The method further includes an operation of obtaining a calibration curve of the DC FEM. The method further includes an operation of performing servo loop to adjust parameters of the DC FEM. The recipe for the DC FEM includes an applied magnetic field. The tool energy shift is verified by calculating a difference between a nominal energy and the real energy. The nominal energy is obtained by calculating a nominal applied magnetic field. The nominal applied magnetic field is calculated based on parameters entered by a user. The real energy is obtained by calculating an actual applied magnetic field by data obtained from the process of applying the WAT recipe to a test sample.

According to some embodiments of the present disclosure, a method of tuning a final energy magnet (FEM) is disclosed. The method includes an operation of obtaining a calibration curve of the DC FEM. An operation of performing servo loop to adjust parameters of the DC FEM. An operation of applying a wafer acceptance test (WAT) recipe to a test sample. An operation of calculating a recipe for a direct current (DC) final energy magnet (FEM). An operation of calculating a real energy of the DC FEM. An operation of verifying a tool energy shift. An operation of tuning the DC FEM based on the verified tool energy shift. An operation of obtaining a peak spectrum of the DC FEM. The recipe for the DC FEM includes an applied magnetic field. The tool energy shift is verified by calculating a difference between a nominal energy and the real energy. The nominal energy is obtained by calculating a nominal applied magnetic field. The nominal applied magnetic field is calculated based on parameters entered by a user. The real energy is obtained by calculating an actual applied magnetic field by data obtained from the process of applying the WAT recipe to a test sample.

According to some embodiments of the present disclosure, an ion implantation system is disclosed. The system includes a sample platform, an ion gun, an electrostatic linear accelerator, and a direct current (DC) final energy magnet (FEM) tuned by operations of applying a wafer acceptance test (WAT) recipe to a test sample on the sample platform, calculating a recipe for the DC FEM, calculating a real energy of the DC FEM, verifying a tool energy shift of the DC FEM, tuning the DC FEM based on the verified tool energy shift, and obtaining a peak spectrum of the DC FEM. The system further includes that the DC FEM is tuned by obtaining a calibration curve of the DC FEM. Also, the system further includes that the DC FEM is tuned by performing servo loop to adjust parameters of the DC FEM. The recipe for the DC FEM includes an applied magnetic field. The tool energy shift is verified by calculating a difference between a nominal energy and the real energy. The nominal energy is obtained by calculating a nominal applied magnetic field.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion implantation system comprising:
   a sample platform;
   an ion gun;
   an electrostatic linear accelerator;
   a direct current (DC) final energy magnet (FEM);
   a processor; and
   a computer readable medium storing software, wherein the software includes an instruction comprising:
   applying a wafer acceptance test (WAT) recipe to a test sample;
   calculating a recipe for the direct current (DC) final energy magnet (FEM);
   calculating a real energy of the DC FEM by data obtained from applying the WAT recipe to the test sample;
   verifying a tool energy shift;
   tuning the DC FEM based on the verified tool energy shift; and
   obtaining a magnetic field of the DC FEM.

2. The ion implantation system of claim 1, wherein the DC FEM is configured to obtain a calibration curve of the DC FEM.

3. The ion implantation system of claim 2, wherein the DC FEM is configured to perform servo loop to adjust parameters of the DC FEM.

4. The ion implantation system of claim 1, wherein the recipe for the DC FEM includes an applied magnetic field.

5. The ion implantation system of claim 1, wherein the processor is programmed to verify the tool energy shift by calculating a difference between a nominal energy and the real energy.

6. The ion implantation system of claim 5, wherein the DC recipe calculator is configured to obtain the nominal energy.

7. The ion implantation system of claim 5, wherein the processor is further programmed to obtain the nominal energy by calculating a nominal applied magnetic field.

8. The ion implantation system of claim 5, wherein the processor is further programmed to obtain the real energy by calculating an actual applied magnetic field by data obtained from a process of applying the WAT recipe to the test sample.

9. An ion implantation system comprising:
   a user interface for inputting parameters and viewing data obtained by the ion implantation system;
   an ion source loading chamber for providing ion source materials;
   an extraction electrode for extracting required ions for the ion implantation system;
   a processor; and
   a direct current (DC) final energy magnet (FEM),
   wherein the processor is programmed to:
      obtain a calibration curve of the DC FEM;
      perform servo loop to adjust parameters of the DC FEM;
      apply a wafer acceptance test (WAT) recipe to a test sample;
      calculate a recipe for the DC FEM;
      calculate a real energy of the DC FEM by data obtained from applying the WAT recipe to the test sample;
      verify a tool energy shift; and
      tune the DC FEM based on the verified tool energy shift.

10. The ion implantation system according to claim 9, wherein the recipe for the DC FEM includes an applied magnetic field.

11. The ion implantation system according to claim 9, wherein the processor is further programmed to verify the tool energy shift by calculating a difference between a nominal energy and the real energy.

12. The ion implantation system according to claim 11, wherein the processor is further programmed to obtain the nominal energy by calculating a nominal applied magnetic field.

13. The ion implantation system according to claim 12, wherein the processor is further programmed to calculate the nominal applied magnetic field based on parameters entered by a user.

14. The ion implantation system according to claim 9, wherein the processor is further programmed to obtain the real energy by calculating an actual applied magnetic field by data obtained from a process of applying the WAT recipe to the test sample.

15. An ion implantation system comprising:
   a sample chamber;
   an acceleration/deceleration column for adjusting a speed of an ion beam;
   a scanning electrode for scanning the ion beam to cover an entire width of a sample;
   a processor;
   a computer readable medium storing software; and
   a direct current (DC) final energy magnet (FEM),
   wherein the software includes an instruction comprising:
      determining an ion trajectory radius, an implantation coverage, and an actually applied magnetic field from the sample;
      calculating a recipe for the direct current (DC) final energy magnet (FEM);
      calculating a nominal applied magnetic field;
      calculating a nominal ion energy;
      calculating an actual ion energy by using the actually applied magnetic field;
      verifying a tool energy shift; and
      turning the ion implantation system based on the verified tool energy shift.

16. The ion implantation system according to claim 15, wherein the processor is programmed to obtain a calibration curve of the DC FEM.

17. The ion implantation system according to claim 16, wherein the processor is further programmed to perform servo loop to adjust parameters of the DC FEM.

18. The ion implantation system according to claim 15, wherein the processor is further programmed to verify the tool energy shift by calculating a difference between the nominal ion energy and the actual ion energy.

19. The ion implantation system according to claim 15, wherein the processor is further programmed to obtain a magnetic field of the DC FEM.

20. The ion implantation system according to claim 15, wherein the processor is further programmed to calculate the nominal applied magnetic field based on parameters entered by a user.

* * * * *